United States Patent
Song et al.

(10) Patent No.: US 8,867,265 B1
(45) Date of Patent: Oct. 21, 2014

(54) SEMICONDUCTOR MEMORY APPARATUS

(71) Applicant: SK Hynix Inc., Icheon-si (KR)

(72) Inventors: Taek Sang Song, Icheon-si (KR); Dae Han Kwon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/301,458

(22) Filed: Jun. 11, 2014

Related U.S. Application Data

(62) Division of application No. 13/340,755, filed on Dec. 30, 2011.

(30) Foreign Application Priority Data

Mar. 30, 2011 (KR) .................. 10-2011-0028860

(51) Int. Cl.
    *G11C 11/00* (2006.01)
    *G11C 13/00* (2006.01)

(52) U.S. Cl.
    CPC ...... *G11C 13/004* (2013.01); *G11C 2013/0045* (2013.01)
    USPC .......................................... 365/163; 365/148

(58) Field of Classification Search
    None
    See application file for complete search history.

(56) References Cited

U.S. PATENT DOCUMENTS

| | | | |
|---|---|---|---|
| 8,134,866 B2 * | 3/2012 | Bae et al. | 365/163 |
| 2010/0103726 A1 * | 4/2010 | Bae et al. | 365/163 |

\* cited by examiner

*Primary Examiner* — Harry W Byrne
(74) *Attorney, Agent, or Firm* — William Park & Associates Patent Ltd.

(57) ABSTRACT

A semiconductor memory apparatus includes a resistive memory cell; a data sensing unit configured to sense an output voltage, formed by a sensing current supplied to the resistive memory cell, based on a reference voltage, and output data having a value corresponding to the sensing result; and a reference voltage generation unit comprising a dummy memory cell including first and second resistors having first and second resistance values, respectively, and configured to output a voltage formed by the sensing current supplied to the dummy memory cell as the reference voltage.

5 Claims, 4 Drawing Sheets

SEMICONDUCTOR MEMORY APPARATUS

CROSS-REFERENCES TO RELATED APPLICATION

The present application claims priority under 35 U.S.C. §119(a) to Korean application number 10-2011-0028860 filed on Mar. 30, 2011 in the Korean Intellectual Property Office, which is incorporated by reference in its entirety.

BACKGROUND

1. Technical Field

The present invention relates to a semiconductor memory apparatus, and more particularly, to technology for reliably sensing data stored in a memory cell.

2. Related Art

A phase change random access memory (PCRAM) may perform random accesses while having the characteristic of a non-volatile memory, and may be highly integrated at a low cost. The PCRAM stores information using a phase change material, and may be a non-volatile memory device using a phase change of a phase change material depending on a temperature condition, that is, a resistance change depending on a phase change.

The phase change material may include a material that is in an amorphous state or crystal state depending on temperature. Representative examples of the phase change material may include a chalcogenide alloy such as Ge2Sb2Te5 (GST) formed of germanium (Ge), antimony (Sb), and tellurium (Te). Therefore, the phase change material may be generally referred to as GST.

The PCRAM causes a reversible phase change between the crystal state and the amorphous state of the GST using Joule heating generated by applying a current or voltage to the GST under a specific condition. The crystal state is referred to as a set state where the GST has low resistance like a metal. The amorphous state is referred to as a reset state where the GST has a higher resistance value than in the set state. The GST stores information through the change in resistance value between the crystal state and the amorphous state, and discriminates the stored information by sensing a voltage change depending on a current flowing in the GST or a voltage change based on a current change.

FIG. 1 is a configuration diagram of a conventional phase change memory apparatus.

Referring to FIG. 1, the phase change memory apparatus includes a sensing current supply unit 11, a comparison unit 13, and a memory cell 12. The sensing current supply unit 11 and the comparison unit 13 may together be referred to as a data sensing unit.

The memory cell 12 includes a phase change element R_GST formed of a phase change material and a cell diode D1.

An NMOS transistor MN0 is inserted between the sensing current supply unit 11 and the memory cell 12. The NMOS transistor MN0 serves to clamp a current and voltage supplied to the memory cell 12 according to the voltage level of a selection signal V_CLP. It is assumed that the selection signal V_CLP maintains a specific voltage level.

When the sensing current supply unit 11 supplies a sensing current I_SENSE to the memory cell 12, the level of an output voltage V_SAI depends on the resistance of the phase change element R_GST. As the resistance of the phase change element R_GST increases, the voltage V_SAI rises, and as the resistance of the phase change element R_GST decreases, the voltage V_SAI drops.

The comparison unit 13 is configured to sense the output voltage V_SAI based on a reference voltage VREF, output voltage VOUT. The voltage VOUT depends on whether the voltage V_SAI is higher or lower than the reference voltage VREF.

FIG. 2 is a graph showing a resistance change of a resistive is memory cell included in the phase change memory apparatus of FIG. 1, depending on a PVT (Process Voltage Temperature) variation.

FIG. 2 includes a first case 21 in which no PVT variation occurs, a second case 22 showing the change of the output voltage V_STI depending on a variation of the sensing current I_SENSE and variations of the threshold voltages Vth of the cell diode D1 and the NMOS transistor MN0, and a third case 23 showing the change of the resistance value of the memory cell depending on a temperature variation. The first case 21 corresponds to a normal case.

The first case 21 is clearly divided into a case R_RESET in which the phase change element R_GST has a large resistance value and a case R_SET in which the phase change element R_GST has a small resistance value. The case R_RESET indicates a resistance distribution of the reset state, and the case R_SET indicates a resistance distribution of the set state. In the first case 21, although the level of the reference voltage VREF is fixed, there is no problem in sensing the output voltage V_SAI.

In the second case 22, the level of the output voltage V_SAI is increased by variations in the threshold voltages Vth of the cell diode D1 and the NMOS transistor NM0. At this time, a data value that should be sensed as the set state may be sensed as the reset state. That is, although the voltage level of the output voltage V_SAI is higher than in the normal case, a margin for discriminating the set state and the reset state is reduced because the voltage level of the reference voltage VREF is fixed. On the other hand, even when the voltage level of the output voltage V_SAI is lower than in the normal case, the margin for discriminating the set state and the reset state is reduced because the voltage level of the reference voltage VREF is fixed.

The third case 23 shows a case in which the resistance value of the phase change element R_GST gradually decreases as the temperature increases. In particular, the resistance distribution of the reset state is moved toward the resistance distribution of the set state such that a margin in resistance value between the set state and the reset state decreases. At this time, since the voltage level of the reference voltage VREF is fixed, a data value which should be sensed as the reset state may be sensed as the set state.

SUMMARY

A semiconductor memory apparatus capable of reliably sensing data independently of a PVT is described.

In one embodiment of the present invention, a semiconductor memory apparatus includes a resistive memory cell; a data sensing unit configured to sense an output voltage, formed by a sensing current supplied to the resistive memory cell, based on a reference voltage, and output data having a value corresponding to the sensing result; and a reference voltage generation unit comprising a dummy memory cell including first and second resistors having first and second resistance values, respectively, and configured to output a voltage formed by the sensing current supplied is to the dummy memory cell as the reference voltage.

In another embodiment of the present invention, a semiconductor memory apparatus includes a resistive memory cell; a first data transmission unit configured to control an amount of current for the resistive memory cell according to a voltage level of a selection signal; a data sensing unit configured to sense a first output voltage formed by a sensing current supplied to the resistive memory cell through the first data transmission unit, based on a reference voltage, and output data having a value corresponding to the sensing result; a dummy memory cell comprising first and second resistors coupled in parallel to each other and having first and second resistance values, respectively; and a second data transmission unit configured to control an amount of current for the dummy memory cell according to the voltage level of the selection signal and output a voltage formed by the sensing current supplied to the dummy memory cell as the reference voltage, wherein the reference voltage has a level in accordance with an intermediate value between the first resistance value and the second resistance value, and the sensing current.

In another embodiment of the present invention, a semiconductor memory apparatus includes a resistive memory cell having a first or second resistance value according to a data value stored therein; a dummy memory cell comprising first and second resistor pairs coupled in parallel to each other and having resistance value of summation of the first resistance value and the second is resistance value respectively; and a data sensing unit configured to sense an output voltage formed by a sensing current supplied to the resistive memory cell, based on a reference voltage formed by the sensing current supplied to the dummy memory cell, and decide a value of output data according to the sensing result, wherein the reference voltage has a level in accordance with an intermediate value between the first resistance value and the second resistance value, and the sensing current.

BRIEF DESCRIPTION OF THE DRAWINGS

Features, aspects, and embodiments are described in conjunction with the attached drawings.

DETAILED DESCRIPTION

A semiconductor memory apparatus according to the present invention will be described below with reference to the accompanying drawings through exemplary embodiments.

Figure 1:
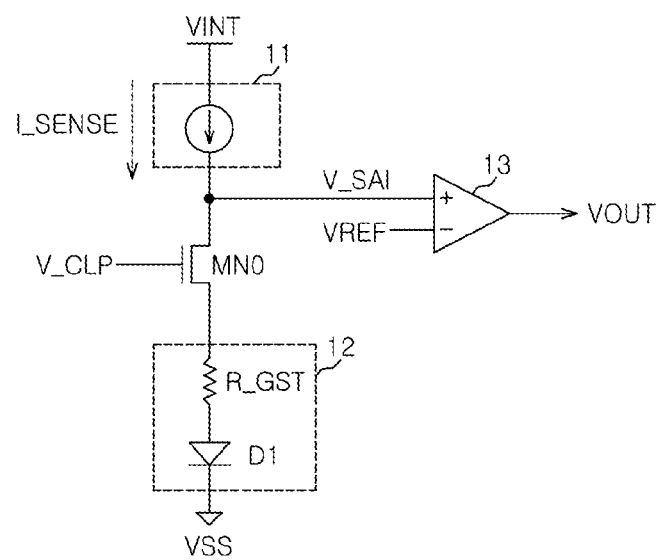
FIG. 1 is a configuration diagram of a conventional phase change memory apparatus.
Figure 2:
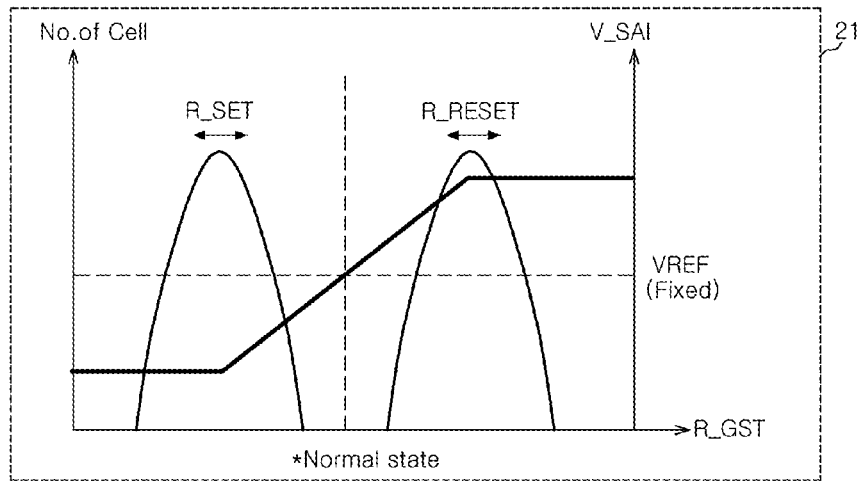
FIG. 2 is a graph showing a resistance change of a resistive memory cell included in the phase change memory apparatus of FIG. 1, depending on a PVT variation.
Figure 2:
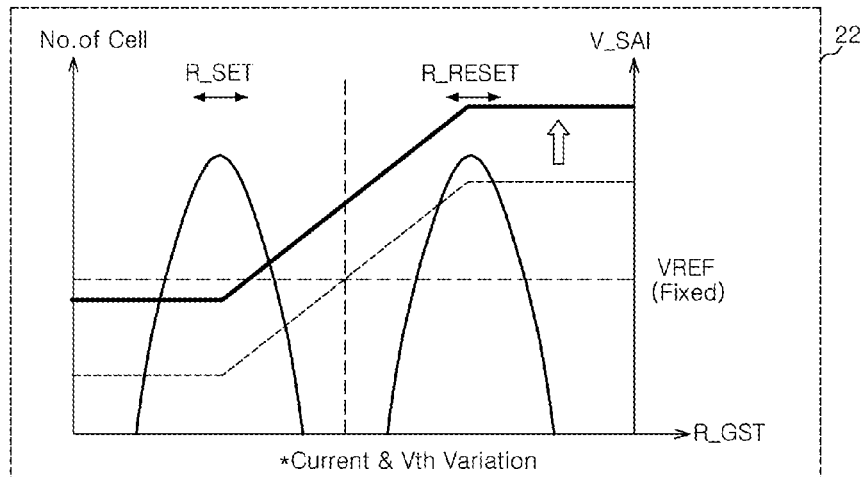
Figure 2:
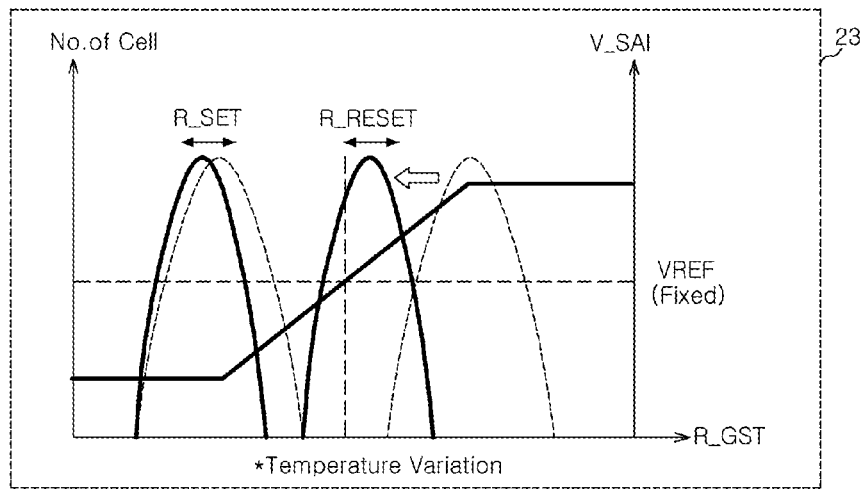
Figure 3:
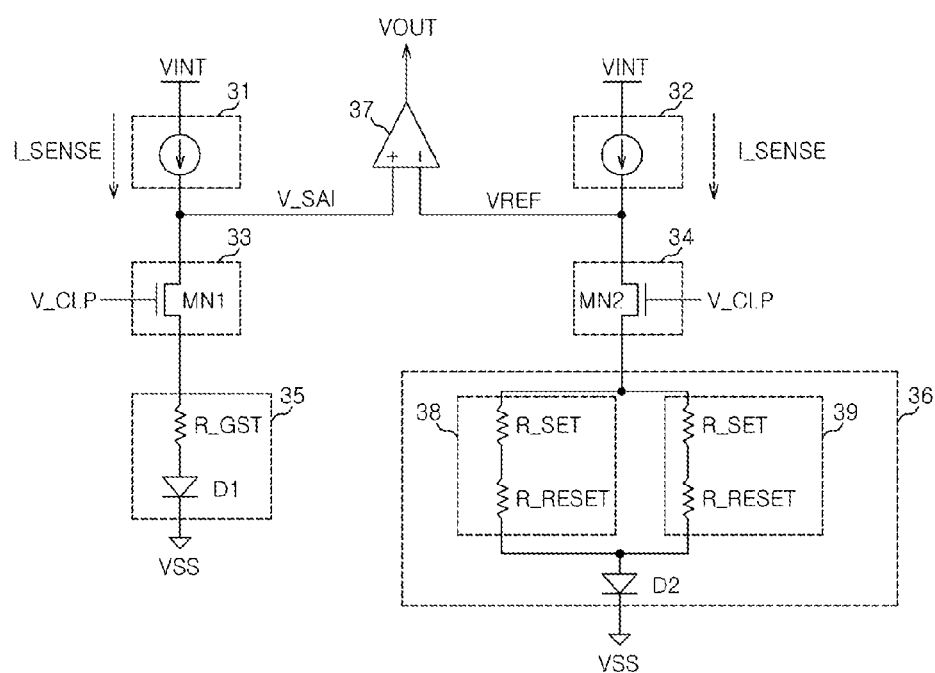
FIG. 3 is an exemplary configuration diagram of a semiconductor memory apparatus according to one embodiment of the invention.

FIG. 3 is a configuration diagram of a semiconductor memory apparatus according to one embodiment.

The semiconductor memory apparatus according to the embodiment includes only simple components for clearly explaining the technical idea of the present invention.

Referring to FIG. 3, the semiconductor memory apparatus includes a resistive memory cell 35, a first data transmission unit 33, a second data transmission unit 34, a first sensing current supply unit 31, a comparison unit 37, a second sensing current supply unit 32, and a dummy memory cell 36.

The detailed configuration and operation of the semiconductor memory apparatus configured in such a manner will be described as follows.

The resistive memory cell 35 includes a resistor R_GST formed of a phase change material and a cell diode D1. In this embodiment, the resistor R_GST formed of a phase change material is taken as an example, but a resistor formed of a different material may also be used in various embodiments. A cathode of the cell diode D1 is configured to receive a ground voltage VSS.

The first sensing current supply unit 31 is configured to generate an output voltage V_SAI due to a sensing current I_SENSE supplied to the resistive memory cell 35. The comparison unit 37 is configured to compare the output voltage V_SAI with respect to a reference voltage VREF, and generate an output voltage VOUT having a value corresponding to the sensing result. The sensing current supply unit 31 and the comparison unit 37 may together be referred to as a data sensing unit.

The first data transmission unit 33 is between the first sensing current supply unit 31 and the resistive memory cell 35 and is configured to control an amount of current, for the resistive memory cell 35 according to the voltage level of a selection signal V_CLP In this embodiment, the first data transmission unit 33 includes an NMOS transistor MN1 controlled by the selection signal V_CLP. The NMOS transistor MN1 is configured to perform a voltage and current clamping operation.

The dummy memory cell 36 includes first resistor pair 38, second resistor pair 39 and a cell diode D2. And the second sensing current supply unit 32 is configured to supply a second sensing current I_SENSE having the same magnitude as the first sensing current I_SENSE to the dummy memory cell 36. In this embodiment, since the first and second sensing currents have the same magnitude, they are collectively referred to as a sensing current I_SENSE. The second sensing current supply unit 32 and the dummy memory cell 36 outputs a voltage formed by the sensing current I_SENSE supplied to the dummy memory cell 36 as the reference voltage VREF. The second sensing current supply unit 32 and the dummy memory cell 36 may be referred to as a reference voltage generation unit.

The dummy memory cell 36 includes first resistor pair 38, second resistor pair 39 and cell diode D2. First resistor pair 38 and second resistor pair 39 is coupled to in parallel to each other. Each of First resistor pair 38 and second resistor pair 39 includes a first resistor R_SET having a first resistance value and a second resistor R_RESET having a second resistance value larger than the first resistance value, wherein the second resistor and the first resistor are coupled to in series to each other. A resistance value of the first resistor pair 38 and the second resistor pair 39 are same to each other. The first and second resistors R_SET and R_RESET are designed in such a manner as to have the same characteristic with respect to PVT, and thus model each of set-state and reset-state of the resistor R_GST included in the resistive memory cell 35, that is, the phase change element.

The resistor R_GST included in the resistive memory cell 35 has a first or second resistance value according to a data value stored therein. That is, the resistor R_GST has the first resistance value in the set state and has the second resistance value in the reset state.

The second data transmission unit 34 is between the second sensing current supply unit 32 and the dummy memory cell 36, and configured to control an amount of current for the dummy memory cell 36 according to the voltage level of the selection signal V_CLP. Furthermore, the second data transmission unit 34 outputs a voltage formed by the sensing current I_SENSE supplied to the dummy memory cell 36 as the reference voltage VREF. In this embodiment, the second data transmission unit 34 includes an NMOS transistor MN2 controlled by the selection signal V_CLP. The NMOS transistor MN2 is configured to perform a voltage and current clamping operation.

In this embodiment, the reference voltage VREF has an intermediate level between a first voltage level and a second voltage level. The first voltage level is formed by the resistor R_GST in the set mode based on the sensing current I_SENSE, and the second voltage level is formed by the resistor R_GST in the reset mode based on the sensing current I_SENSE. Note that other embodiments of the invention may use a single resistor whose resistance is between the resistance of the resistor R_GST in the set mode and the resistor R_GST in the reset mode.

When a PVT variation occurs, the resistance value of the resistor R_GST included in the resistive memory cell 35 may change. In this case, since the first resistor R_SET, the second resistor R_RESET, and the resistor R_GST are designed in such a manner as to have the same characteristic, they have the same resistance change amount. Furthermore, when the threshold voltages Vth of the cell diodes D1 and D2 and the NMOS transistors MN1 and MN2 are varied, the first resistor R_SET, the second resistor R_RESET, and the resistor R_GST have the same voltage change amount because the cell diodes D1 and D2 will be similarly affected, and the NMOS transistor MN1 and MN2 will be similarly affected. For reference, the condition in which the first resistor R_SET, the second resistor R_RESET, and the resistor R_GST have the same voltage change amount and the same resistance change amount may be limited to the first or second resistor R_SET or R_RESET having the same resistance state as the resistor R_GST. The resistor of the dummy memory cell 36 having a different resistance state from the resistor R_GST of the resistive memory cell 35 may have a slightly different change amount.

Figure 4:
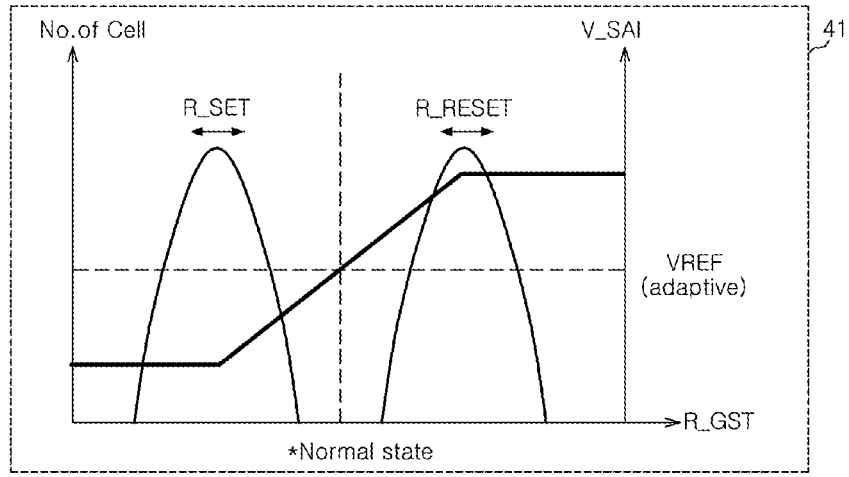
FIG. 4 is a graph showing a resistance change of a resistive memory cell included in the semiconductor memory apparatus of FIG. 3, depending on a PVT variation.
Figure 4:
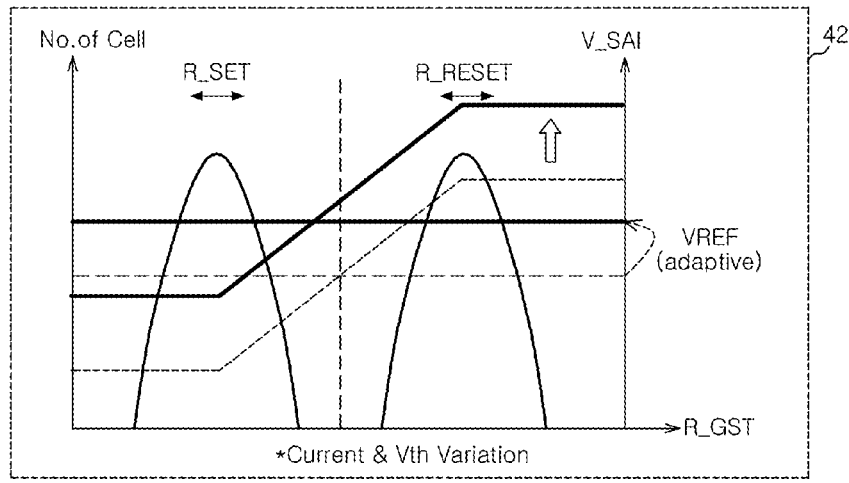
Figure 4:
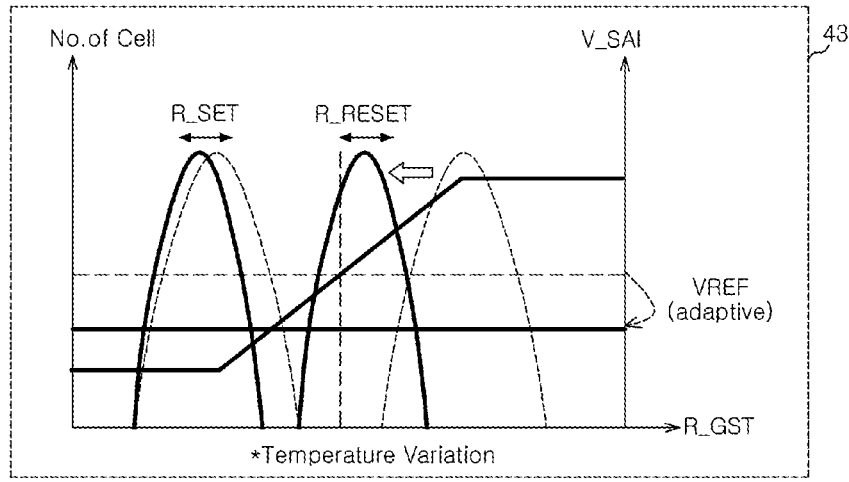

FIG. 4 is a graph showing a resistance change of the resistive memory cell included in the semiconductor memory apparatus of FIG. 3, depending on a PVT variation.

FIG. 4 includes a first case 41 in which no PVT variation occurs, a second case 42 showing the change of the output voltage V_SAI depending on a variation of the sensing current I_SENSE and variations of the threshold voltages Vth of the cell diode D1 and the NMOS transistor MN1, and a third case 43 showing the resistance change of the resistive memory cell depending on a temperature variation.

The first case 41 corresponding to a normal case is clearly divided into a case R_RESET in which the phase change element R_GST has a large resistance value and a case R_SET in which the phase change element R_GST has a small resistance value. The case R_RESET indicates a resistance distribution of the reset state, and the case R_SET indicates a resistance distribution of the set state. The level of the reference voltage VREF is formed with an intermediate value between a first voltage level and a second voltage level. The first voltage level is formed by the first resistance value, that is, the resistance value of the set state, and the second voltage level is formed by the second resistance value, that is, the resistance value of the reset state. Therefore, there should not be a problem in sensing the output voltage V_SAI.

In the second case 42, the level of the output voltage V_SAI is increased by the variations of the threshold voltages Vth of the cell diode D1 and the NMOS transistor MN1. Since the level of the reference voltage VREF is formed with the intermediate value between the first voltage level formed by the first resistance value, that is, the resistance value of the set state and the second voltage level formed by the second resistance value, that is, the resistance value of the reset state, the level of the reference voltage VREF also increases. Therefore, since a sufficient margin for discriminating the set state and the reset state is provided, there occurs no occur in sensing the output voltage V_SAI. On the other hand, even when the voltage level of the output voltage V_SAI is lower than in a normal case, the level of the reference voltage VREF decreases in response to the voltage level. Therefore, a sufficient margin for discriminating the set state and the reset state is provided.

The third case 43 shows a case in which the resistance value of the resistor R_GST gradually decreases as the temperature increases. That is, the resistance distribution of the reset state is moved toward the resistance distribution of the set state such that a margin between the set state and the reset state decreases. Since the level of the reference voltage VREF is formed with the intermediate value between the first voltage level formed by the first resistance value, that is, the resistance value of the set state and the second voltage level formed by the second resistance value, that is, the resistance value of the reset state, the level of the reference voltage VREF decreases. Therefore, since a sufficient margin for discriminating the set state and the reset state is secured, there occurs no problem in sensing the output voltage V_SAI.

In short, the reference voltage VREF is generated by the sensing current supplied to the first resistor R_SET in parallel with the second resistor R_RESET, where the effective resistance parallel resistors is between the resistances of the resistor R_GST in the set state and the reset state. Since the voltage level of the reference voltage VREF adaptively increases or decreases in response to a PVT variation, it is possible to secure a sufficient margin for discriminating the set state and the reset state.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a resistive memory cell;
   a first data transmission unit configured to control an amount of current for the resistive memory cell according to a voltage level of a selection signal;
   a data sensing unit configured to sense a first output voltage formed by a sensing current supplied to the resistive memory cell through the first data transmission unit, based on a reference voltage, and output data having a value corresponding to the sensing result;
   a dummy memory cell comprising first and second resistors coupled in parallel to each other and having first and second is resistance values, respectively; and
   a second data transmission unit configured to control an amount of current for the dummy memory cell according to the voltage level of the selection signal and output a voltage formed by the sensing current supplied to the dummy memory cell as the reference voltage,
   wherein the reference voltage has a level in accordance with an intermediate value between the first resistance value and the second resistance value, and the sensing current.

2. The semiconductor memory apparatus according to claim 1, wherein the first and second resistors are designed in such a manner as to have the same characteristic by modeling a resistor included in the resistive memory cell.

3. The semiconductor memory apparatus according to claim 1, wherein a resistor included in the resistive memory cell has the first or second resistance value according to a data value stored therein.

4. The semiconductor memory apparatus according to claim 3, wherein the resistor is formed of a phase change material.

5. The semiconductor memory apparatus according to claim 1, wherein the first and second resistors are configured to have the is same resistance change amount as a resistor included in the resistive memory cell, according to a PVT variation.

* * * * *